United States Patent
Gertsch et al.

(10) Patent No.: US 6,598,730 B1
(45) Date of Patent: Jul. 29, 2003

(54) PARTS FEED DEVICE

(75) Inventors: Christoph Gertsch, Steffisburg (CH); Olivier Ryser, Vaumarcus (CH)

(73) Assignee: Mikron SA Boudry, Boudry (CH)

(*) Notice: Subject to any disclaimer, the term of this patent is extended or adjusted under 35 U.S.C. 154(b) by 0 days.

(21) Appl. No.: 09/959,773
(22) PCT Filed: May 3, 2000
(86) PCT No.: PCT/CH00/00244
  § 371 (c)(1),
  (2), (4) Date: Dec. 10, 2001
(87) PCT Pub. No.: WO00/69240
  PCT Pub. Date: Nov. 16, 2000

(30) Foreign Application Priority Data

May 7, 1999 (EP) .............................. 99810403

(51) Int. Cl.[7] ................ B65G 37/00; B65G 25/04; B65G 47/24
(52) U.S. Cl. .................. 198/580; 198/394; 198/750.1
(58) Field of Search ................ 198/394, 431, 198/443, 468.6, 580, 750.1, 752.1

(56) References Cited

U.S. PATENT DOCUMENTS

| | | | |
|---|---|---|---|
| 4,678,073 A | | 7/1987 | Anderson et al. |
| 5,314,055 A | * | 5/1994 | Gordon ............ 198/395 |
| 5,687,831 A | | 11/1997 | Carlisle |
| 5,853,078 A | * | 12/1998 | Kneubuhler ........ 198/391 |
| 6,116,409 A | * | 9/2000 | Yokajty et al. ...... 198/752.1 |

FOREIGN PATENT DOCUMENTS

| | | |
|---|---|---|
| EP | A1 0 272 757 | 6/1988 |
| EP | A1 0 439 234 | 7/1991 |

* cited by examiner

Primary Examiner—Christopher P. Ellis
Assistant Examiner—Gene O Crawford
(74) Attorney, Agent, or Firm—Birch, Stewart, Kolasch & Birch, LLP.

(57) ABSTRACT

A parts feeder for a robot has a selection zone accessible to the robot, a device for changing the orientation and/or the position of the parts stochastically, and a device with a parts recirculation element for recirculating the parts. The device for changing the orientation and/or the position of the parts stochastically is a vibrating platform constructed at the same time as a selection zone vibrating platform can be brought relative to each other into two different positions in such a way that in the first position the vibrating platform can be brought relative to each other into two different positions in such a way that in the first position the vibrating platform can be loaded with parts from the parts recirculation element and in the second position the parts which fall down from the vibrating platform can be collected by the parts recirculation element. By constructing the parts recirculation element firstly as a parts reservoir for loading the vibrating platform with parts from the parts recirculation element and, secondly, as a collecting element for parts falling down from the vibrating platform, the parts feeder can manage without a parts transport device for horizontal conveyance of the parts, such as conveyor belts, linear rails or the like. This permits an extremely simple and space-saving construction of the parts feeder.

12 Claims, 3 Drawing Sheets

PARTS FEED DEVICE

This application is the national phase under 35 U.S.C. §371 of PCT International Application No. PCT/CH00/0024 which has an International filing date of May 3, 2000, which designated the United States of America.

FIELD OF THE INVENTION

The invention relates to a parts feeder according to the preamble of claim 1.

PRIOR ART

For the transfer of parts, which are supplied in the form of bulk goods in a storage container, to a robot, the parts as a rule firstly have to be separated from one another (that is to say individualized) and brought into an orientation and position suitable for the transfer to the robot. This task is carried out by parts feeders, as they are known (also referred to as feed systems). A parts feeder accordingly picks up parts in the form of bulk goods, separates the parts and transfers them in a suitable orientation and position to a robot. The robot grips the suitably oriented parts in a selection zone of the parts feeder and subsequently transfers them for further processing and/or mounting to a mounting system, a processing station or the like. In this connection, a robot is to be understood as any kind of apparatus for gripping parts in a favorable orientation and position and subsequently conveying them away from the point at which they are gripped or selected.

Most customary parts feeders comprise a mechanical filter in the form of a vibrating pot which can be rotated about a vertical axis to separate the parts and to orient and position the same. The pot is provided with internal, spiral volutes. Arranged along the volutes are a large number of mechanical guide elements and barriers. On account of the vibrating rotational movement of the pot, the parts are transported upward along the volutes to the outlet of the pot. By means of the barriers and guide elements, only parts in a specific orientation are transported as far as the outlet of the pot, the remainder fall back onto the bottom of the pot in order to begin a renewed transport operation along the volutes. From the outlet of the pot, the parts are typically conveyed onward via linear rails, in order to maintain their separation and orientation.

The mechanical filters in the form of vibrating pots have the disadvantage that they are tailored specifically to specific parts. They are extremely inflexible in relation to changes in the parts. In the event of a modification to the geometric form of the parts, most often the entire vibrating pot has to be redesigned, constructed and tested. In addition, both the volutes of vibrating pots and the linear rails adjacent to the pots are susceptible to blockages as a result of defective and/or particularly unfavorably positioned parts, in particular when the latter have a complicated geometric form.

In the U.S. Pat. No. 5,687,831 (Adept Technology), a parts feeder is described which, as compared with vibrating pots, exhibits improved flexibility in relation to different parts forms. The parts feeder according to U.S. Pat. No. 5,687,831 comprises an essentially horizontal transport section on which the parts are transported to a selection zone. In the selection zone, favorably oriented and arranged parts are detected by means of a video camera and are subsequently gripped by a robot and transferred to a mounting system. The parts that are not selected are guided back to the start of the transport section by means of a recirculation system for a renewed passage through the parts feeder. While they are being fed back, the orientation and the position of the parts are changed in order that they may be oriented favorably during the next pass and selected in the selection zone.

Although the parts feeder according to U.S. Pat. No. 5,687,831 is to a certain extent flexible in relation to different parts forms, it is relatively complicated in design terms and requires a considerable amount of space for the arrangement of the transport section, the selection zone and the recirculation system.

SUMMARY OF THE INVENTION

It is an object of the present invention to provide a parts feeder which is simple in design terms, space-saving and flexible in relation to different parts forms.

The object is achieved as defined by the features of the independent patent claims.

According to the invention, a parts feeder for a robot has a selection zone accessible to the robot, a device for changing the orientation and/or the position of the parts stochastically, and a device with a parts recirculation element for recirculating the parts. The device for changing the orientation and/or the position of the parts stochastically is a vibrating platform constructed at the same time as a selection zone. The parts recirculation element and the vibrating platform can be brought relative to each other into two different positions in such a way that in the first position the vibrating platform can be loaded with parts from the parts recirculation element and in the second position the parts which fall down from the vibrating platform can be collected by the parts recirculation element.

In the course of the present description and the claims, a parts recirculation element is always to be understood as an element provided to recirculate parts. Such a parts recirculation element can be constructed, for example, as a separate section, as a zone or parts carrying area which can be moved with respect to the vibrating platform, as a recirculation container constructed so as to accommodate a few parts, or as a storage container constructed so as to accommodate a large quantity of parts.

The parts recirculation element is used firstly, in a first position, to load the vibrating platform with parts. As soon as the vibrating platform has been loaded with a sufficient number of parts, the parts recirculation element and the vibrating platform are brought relative to each other into a second position, in which the same parts recirculation element is used to collect parts which fall down from the vibrating platform during the vibration. At the same time, the vibrating platform serves as a selection zone for the parts feeder, that is to say the parts are gripped by the robot on the vibrating platform and conveyed away. (The actions of gripping the parts and conveying them away is also referred to as selecting the parts.) If the number of parts remaining on the vibrating platform falls below a minimum number, the parts recirculation element and the vibrating platform are brought relative to each other into the first position again, in order to load the vibrating platform again with parts from the parts recirculation element. As a result, the parts which have fallen down from the vibrating platform onto or into the parts recirculation element are guided back to the vibrating platform and are therefore recycled. The parts recirculation element therefore serves alternately as a parts reservoir for loading the vibrating platform with parts and as a collecting element for collecting the parts that fall down from the vibrating platform, in order subsequently to recycle the latter. Because the same element is used to load the vibrating platform with parts and to collect the parts falling down from the vibrating platform, the necessity for separate parts transport devices to feed back the parts that have fallen down from the vibrating platform, and their renewed feeding to the vibrating platform are dispensed with. As opposed to previously known parts feeders, the parts feeder according to the invention therefore manages without any parts transport devices for horizontal parts conveyance, such as conveyor belts, linear rails or the like. This permits an extremely simple and space-saving construction of the parts feeder according to the invention. In addition, as a result of the elimination of the conveyor belts and linear rails, which are susceptible to blockage, the risk of blockage of the entire parts feeder can be reduced substantially.

The vibrating platform and the parts recirculation element can be moved relative to each other. In order to produce the relative movement, either the vibrating platform can be arranged to be substantially fixed to a frame of the parts feeder, and the parts recirculation element can be arranged to be movable with respect to this frame and therefore to the vibrating platform. Or, vice versa, the parts recirculation element can be arranged to be fixed to the frame of the parts feeder and the vibrating platform can be arranged to be movable on the frame. It goes without saying that, in principle, both the parts recirculation element and the vibrating platform can be arranged to be movable on the frame of the parts feeder, in order to provide relative movement between the parts recirculation element and the vibrating platform.

The parts recirculation element can be designed like a trough, that is to say as a container open at the top and having a bottom and side walls, in order to assist the collection of the parts in the second position. The parts can then simply fall down from above into the trough-like parts recirculation element.

The parts recirculation element is preferably provided with an interchangeable upper part, the upper side of this upper part being adapted to a desired number of parts which, in the first position of the parts recirculation element, are conveyed from the parts recirculation element to the vibrating platform in order to load the vibrating platform.

According to a preferred embodiment of the invention, the parts recirculation element is arranged in the immediate vicinity of the vibrating platform and can be displaced in the manner of a lift in the vertical direction between the first position for loading the vibrating platform and the second position for collecting the parts. In the first, raised position, the parts recirculation element is arranged at a level that is increased with respect to the vibrating platform in such a way that the parts are conveyed from the parts recirculation element to the vibrating platform substantially by the force of gravity. In the second, lowered position, the parts recirculation element is arranged at a level that is lower with respect to the vibrating platform in such a way that the parts that fall down from the vibrating platform as a result of the vibration of the latter fall onto or into the parts recirculation element substantially on account of the force of gravity. In order to load the vibrating platform with parts, a parts recirculation element of trough-like design can be provided with a lateral outlet opening. As an alternative, a parts recirculation element can also be designed like a funnel, the vibrating platform being arranged at the center of the funnel-like parts recirculation element. It is preferable for the bottom of the parts recirculation element, carrying the parts, to be inclined downward toward the vibrating platform so that the parts flow toward the vibrating platform merely on account of the force of gravity. This represents an extremely simple possible way of conveying parts within the parts recirculation element.

In a parts feeder for a robot, having a selection zone accessible to the robot, and a device for changing the orientation and/or the position of the parts stochastically, the device for changing the orientation and/or the position of the parts stochastically can be a vibrating platform constructed at the same time as a selection zone, the vibrating platform being constructed to execute vibrating movements with a single mechanical degree of freedom. In this case, the number of degrees of freedom is, as usual, understood to mean the number of mutually independent determinants (coordinates) which are needed in order to determine the system uniquely. For example, a mass point that can move freely in space has three mechanical degrees of freedom, while a mass point that moves on a curve has one degree of freedom. Since, in the case of a parts feeder according to this variant of the invention, the entire vibrating platform has to be moved simply with a single mechanical degree of freedom, the vibrating platform itself, the drive for producing the vibrating movement us [sic] therefore the entire parts feeder can be constructed extremely simply and cost-effectively. For example, a cost-effective, simple vibrating device can be used for the drive of the vibrating platform, as is common for constructional machines. It is clear that this aspect of the invention does not necessarily have to be used in connection with the parts recirculation element that can be moved with respect to the vibrating platform in order to recirculate the parts.

The vibrating platform that can be moved with a single mechanical degree of freedom is preferably constructed to execute vibrating movements substantially in the vertical direction, so that the vibrations or the vibrating movements are carried out only in the vertical direction. As opposed to previous parts feeders, the parts are then not specifically conveyed in a horizontal direction by the vibrating platform. The vibrating platform merely has the function of separating the parts by throwing the latter repeatedly upward and of changing their orientation and their position stochastically. In addition, it is advantageous if the vibrating platform is provided with a drive device for generating the vibrating movement, which permits optional setting of the frequency, the amplitude and the duration of the vibrating movement. The frequency, the amplitude and the duration of the vibrating movement can in particular be set by software in order to provide a programmable control device to control the vibrating platform. By setting the frequency, the amplitude and the duration of the vibrating movement, the parts feeder can be adapted in a simple way to different parts forms. Before processing parts with a new form, these parameters can be optimized, in a setting or test phase, for the greatest possible efficiency with regard to the desired orientation and/or position of the parts to be processed.

The vibrating platform of a parts feeder according to the invention can also be provided with an interchangeable supporting surface on the upper side of the platform, it being possible for the supporting surface ("tooling plate"), on which the parts come to lie, to be structured and to be adapted to specific parts forms and/or specific parts ranges. This provides the possibility of arranging the parts, by means of stochastic vibration, in an orientation whose probability of occurrence is comparatively low. In this way, for example, parts can be arranged to stand on their narrow side. In addition to the abovementioned settable parameters of the vibrating movement, the interchangeable supporting surface permits further simple possible adaptation of the parts feeder to different parts forms, by the supporting surface being able to be interchanged for a new parts form and replaced by a supporting surface adapted to the new parts form.

According to a further preferred embodiment of the invention, the parts feeder further comprises a detection device for detecting the orientation and the position of the parts on the vibrating platform, and also data transmission means for transmitting the detected orientations and positions to the robot, in order to assist the selection of the parts by the robot on the vibrating platform, serving at the same time as a selection zone. The detection device preferably comprises means for optical orientation and position detection and also means for illuminating the vibrating platform, the optical detection means and the illumination means being arranged in a common housing. The housing can be provided with a viewing opening aimed at the platform, the housing preferably being simply open in the direction of the platform, in order to prevent disruption caused by the influence of external light. Furthermore, the housing can be movable over the vibrating platform, in order to detect the orientation and the position of the parts. For this purpose, the housing can be arranged on a substantially horizontal running rail arranged above the vibrating platform. By means of the camera, which can be moved over the vibrating platform together with the illumination means in a housing, the parts feeder becomes independent of the robot to which it feeds the parts. In the case of a parts feeder with a stationary camera and a robot which moves in the visible area between the camera and the selection zone, this is not so.

According to a method according to the invention for operating a parts feeder for a robot, the following steps are carried out one after another in a continuous endless procedure: in a first step, a vibrating platform constructed so as to change the orientation and/or the position of the parts stochastically by vibrating, and a parts recirculation element, are moved relative to each other into a first position, the vibrating platform then being loaded with parts from the parts recirculation element in this first position. In a second step, the vibrating platform and the parts recirculation element are moved relative to each other into a second position to collect parts which fall down from the vibrating platform. The parts are collected in or on this parts recirculation element. In a third step, the orientation and/or the position of the parts on the vibrating platform is/are changed stochastically by vibrating the vibrating platform, any parts that fall down from the vibrating platform being collected by the parts recirculation element. In a fourth step, the orientation and the position of the parts on the vibrating platform are detected, and the corresponding orientation and position data are transmitted to the robot. In a fifth step, depending on the transmitted orientation and position data of the parts, any parts with a favorable orientation and position are gripped by the robot on the vibrating platform, serving at the same time as a selection zone, and are conveyed away, that is to say selected. In a sixth step, the number of parts remaining on the vibrating platform is determined, a return then being made either to the third step or to the first step, depending on this number. If the number of parts remaining on the vibrating platform is lower than a predefined minimum number, then a return is made to the first step, otherwise to the third step.

In a variant of the method, instead of the control by the sixth step, the return to the first step can be controlled by the expiry of a predefined time since the last execution of the first step. In another variant, this return to the first step can be controlled by the area coverage of the vibrating platform.

In the case of a parts recirculation element designed like a trough, the method can further comprise a seventh step, which is executed after the sixth step before the return to the first step, the number of parts in the parts recirculation element being determined in this seventh step and the parts recirculation element being filled with new parts on the basis of this number. As an alternative to putting the new parts into the trough-like parts recirculation element, the new parts can also be conveyed directly onto the vibrating platform by an additional conveying device.

The method according to the invention for the operation of a parts feeder for a robot is preferably carried out completely automatically, so that no manipulations by hand are necessary.

The following detailed description of the present invention, in conjunction with the appended drawings, serves only as an example for better understanding of the invention, and should not be interpreted as restricting the protective range of the patent claims. For those skilled in the art, further advantageous types of embodiment and combinations of features can readily be recognized from the following description in connection with the appended drawings and all of the patent claims, but always still lie within the scope of the present invention.

BRIEF DESCRIPTION OF THE DRAWINGS

In the drawings used to explain the exemplary embodiments.

DESCRIPTION OF THE PREFERRED EMBODIMENTS

Figure 1:
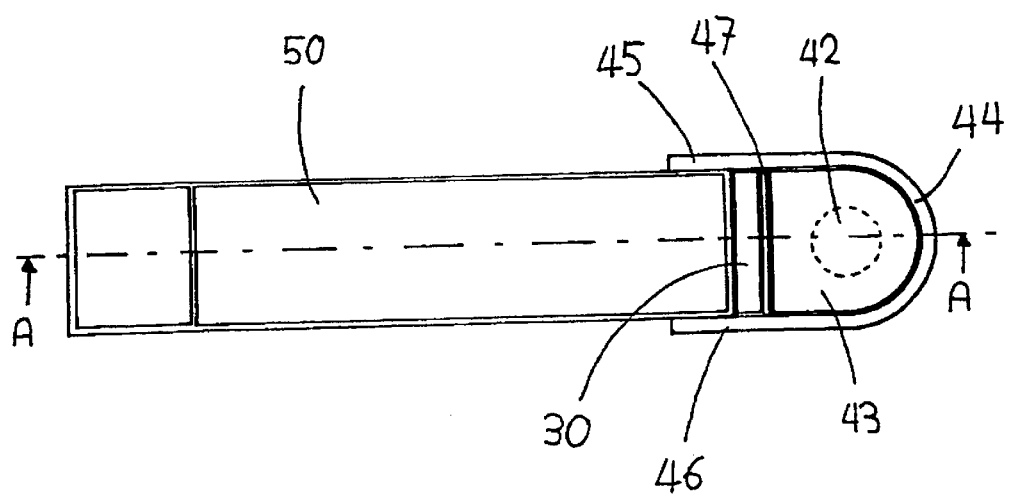
FIG. 1 shows a preferred type of embodiment of a parts feeder according to the invention for a robot, from above in a simplified plan view.
Figure 2:
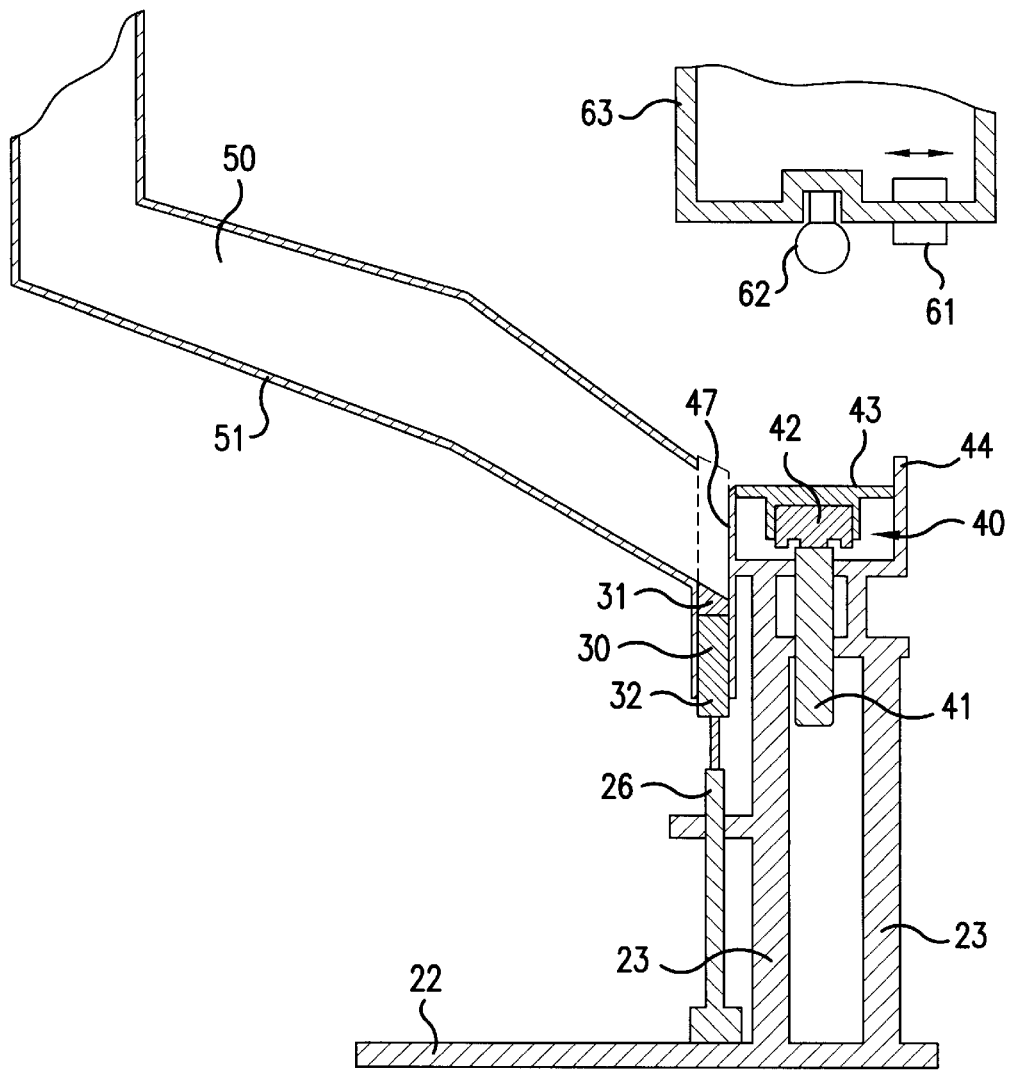
FIG. 2 shows the parts feeder from FIG. 1 in a simplified side view sectioned along the line A—A.

The parts feeder illustrated in FIGS. 1 and 2 for a robot (not illustrated) comprises a frame with a base 22, to which a solid, hollow cylindrical column 23 projecting vertically upward is fixed. Permanently fitted in the upper area of the column 23 is a housing 41 comprising the drive of a vibrating device. The housing 41 is substantially arranged in the hollow interior of the hollow cylindrical column 23. The vibrating device, in the form of a pneumatic vibrator such as is in widespread use for applications in constructional machines, further comprises a base part 42, which can be moved with respect to the vibrator housing 41, being excited into substantially vertically oriented vibration or shaking movements by the vibrator drive. (The base part, actually covered in the plan view of FIG. 1, is indicated in FIG. 1 by broken lines.) The vibrator 41, 42 is provided with a vibrator control device, which permits computer-controlled setting of the frequency, the amplitude and the duration of the vibration.

Arranged on the base cart 42 of the vibrator is a supporting surface 43 similar to a plate ("tooling plate"), which serves as a support for the parts to be fed to the robot by the parts feeder. The supporting surface 43 is permanently connected to the base part 42 and, together with the latter, forms a vibrating platform 40 which can be moved with vibrating movements with respect to the vibrator housing 41 and the column 23, in order in a vibrating operation to change the orientation and/or the position of the parts lying on the vibrating platform 40 or the supporting surface 43 stochastically. If required, the supporting surface 43 can be detached from the base part 42 and replaced by a different supporting surface, in order to adapt the vibrating platform 40 to different parts forms. Overall, the vibrating platform 40 is mounted on the column 23 in such a way that it can be moved substantially only in the vertical direction with respect to the column 23, in order to be able to execute shaking or vibrational movements in the vertical direction. In the horizontal direction, on the other hand, the vibrating platform 40 is arranged to be undisplaceable with respect to the column 23.

To the side of the vibrating platform 40, immediately adjacent thereto, a parts recirculation element 30 or a parts conveying element 30 is arranged, which serves to convey the parts to be fed to the robot by the parts feeder. The parts recirculation element 30 can be displaced with respect to the column 23 and with respect to the vibrating platform 40 in the manner of a lift in the substantially vertical direction between a first position for loading the vibrating platform 40 with parts from the parts recirculation element 30 and a second position for collecting parts which fall down from the vibrating platform 40.

For the purpose of displacement in the vertical direction, the parts recirculation element 30 is guided in the vertical direction by a linear guide fitted to the column 23, and is driven in the vertical direction by a lifting drive 26 acting between the column 23 and the darts recirculation element 30 in the form of a pneumatic piston/cylinder arrangement.

On the side of the parts recirculation element 30 remote from the vibrating platform 40, to the side of and adjacent to said parts recirculation element 30, there is arranged a parts storage container 50 or a parts reservoir 50, which is designed to accommodate a large quantity of parts to be fed to the robot. The bottom 51 of the parts storage container 50 is inclined falling toward the side of the parts recirculation element 30 in such a way that the parts slip toward this side of the parts storage container 50 merely on account of the force of gravity. The parts storage container 50 therefore simultaneously has the function of a feed chute which conveys the parts toward the parts recirculation element 30.

In relation to the conveying or flow direction of the parts in the parts storage container 50, the parts recirculation element 30 forms a front boundary wall of the parts storage container 50, which can be displaced in the vertical direction in the manner of a slider in order optionally to open or to close the parts storage container 50. When the parts recirculation element 30 is in the first position (illustrated by broken lines in FIG. 2) for loading the vibrating platform 40 with parts from the parts recirculation element 30, then the parts storage container 50 is bounded and closed by that side of the parts recirculation element 30 which is oriented toward the parts storage container 50. In the second, lowered position of the parts recirculation element 30, illustrated in FIG. 2 by continuous lines, the parts storage container 50 is open to the front, in the direction of the parts recirculation element 30 and of the vibrating platform 40. In this second position, the parts recirculation element 30 serves firstly to collect parts which fall down from the vibrating platform 40. Secondly, in this second position, at the same time parts can flow from the parts storage container 50 onto the parts recirculation element 30. On the next occasion on which the parts recirculation element 30 is raised into the first position, all the parts lying on the parts recirculation element 30, that is to say both the parts that have fallen down from the vibrating platform 40 and the parts which have flowed from the storage container 50 onto the parts recirculation element 30, can then be conveyed onto the vibrating platform 40.

The parts recirculation element 30 has a substantially rectangular upper side, on which the parts slipping out of the parts storage container 50 and/or the parts falling down from the vibrating platform 40 come to lie. This upper side of the parts recirculation element 30 has the function of a parts carrying surface for carrying the parts. When the parts recirculation element 30 is displaced upward, this parts carrying surface has, in relation to the parts lying on it, the function of a conveying platform or a lifting platform, on which the parts are conveyed upward.

The parts recirculation element 30 is composed of two parts, namely a lower part 32, which is connected to the lifting device 26 mentioned above, and an upper part 31, which has the parts carrying surface mentioned above or the upper side of the parts recirculation element 30. The upper part 32 can be detached from the lower part 31 as required and replaced by a different upper part. This different upper part can have an upper side of a different shape. By means of appropriate configuration of the upper side of the [sic] of the upper part (and therefore of the upper side of the parts recirculation element 30), it is possible to determine the quantity of parts which is conveyed onto the vibrating platform 40 by means of the parts recirculation element 30 during each lifting operation. For example, this upper side can be of wedge-like design, with a face falling toward the vibrating platform 40 and a face falling toward the parts storage container 50. During each lifting operation, only those parts lying on the face falling toward the vibrating platform 40 will then be conveyed onto the vibrating platform 40.

The substantially flat upper side of the parts recirculation element 30, serving as the parts carrying surface, is inclined downward toward the side of the vibrating platform 40. In the second, lowered position of the parts recirculation element 30, the inclined upper side of the parts recirculation element 30 forms a front extension of the bottom 51 of the parts storage container 50, the parts slipping from the parts storage container 50 onto the upper side of the parts recirculation element 30 on account of the force of gravity. The inclination of the upper side of the parts recirculation element 30 is chosen in such a way that when the parts recirculation element 30 is in the first (raised) position for loading the vibrating platform 40 with parts from the parts recirculation element 30, the parts on the upper side of the parts recirculation element 30 flow or slip toward the vibrating platform 40 merely on account of the force of gravity.

Along its vertical displacement path, the parts recirculation element 30, having a substantially rectangular cross section, is enclosed on three sides by vertical boundary walls 45, 46, 47, which are permanently fitted to the column 23. In the second, lowered position of the parts recirculation element 30, these boundary walls 45, 46, 47 form a vertical shaft closed on three sides, into which the parts falling down from the vibrating platform 40 fall. The shaft cross section corresponds to the cross section of the parts recirculation element 30. The bottom of the shaft is formed by the upper side of the parts recirculation element 30. On the fourth side of the parts recirculation element 30, toward the parts storage container 50, the shaft is open.

The shaft wall 47 arranged between the vibrating platform and the parts recirculation element 30 extends downward from the level of the vibrating platform 40 or its supporting surface 43. In the first, raised position of the parts recirculation element 30, the entire upper side of the parts recirculation element 30 projects beyond the upper edge of this wall 47. The upper side of the parts recirculation element 30 in this first position lies at a higher level than the vibrating platform 40, so that the parts slip onto the vibrating platform 40 from the parts recirculation element 30 over the upper edge of the shaft wall 47 located between them. In the second, lowered position of the parts recirculation element 30, the upper side of the parts recirculation element 30 lies at a lower level than the level of the vibrating platform 40, and the parts fall from the vibrating platform 40 onto the parts recirculation element 30 over the upper edge of the shaft wall 47 lying between them.

The two other shaft walls 45, 46 are formed as an extension of a vertical boundary wall 44 which rests closely against the vibrating platform 40 and encloses the latter in a U shape. This boundary wall 44 is also permanently fitted to the column 23 of the parts feeder. It extends upward beyond the level of the vibrating platform 40 and prevents the parts on the sides closed off by the boundary wall 44 being able to fall down from the vibrating platform 40. The parts can merely fall down from the vibrating platform 40 on the side facing the parts recirculation element 30. The two arm-like extensions 45, 46 of this boundary wall 44, with a U-shaped outline, enclose the parts recirculation element 30 on two sides and in each case form a side wall 45, 46 of the shaft mentioned above. They extend upward beyond upper side of the parts recirculation element 30 in its first, raised position, in order to prevent the parts being able to fall down from the parts recirculation element 30 on a side other than that facing the vibrating platform 40.

The parts feeder illustrated in FIGS. 1 and 2 is also provided with a detection device for detecting the orientation and the position of the parts of the vibrating platform, and also with data transmission means, in order to transmit the detected orientations and positions to the robot, in order that the latter can select the parts on the vibrating platform 40 on the basis of the orientation and position data received from the detection device. The detection device comprises a camera for optical orientation and position detection and also means for illuminating the vibrating platform 40, the camera 61 and the illumination means 62 being arranged in a common housing 60. The housing is provided with a viewing and illumination opening pointing toward the vibrating platform. Otherwise, the housing is sealed so as to be opaque, in order to prevent disruption arising from the influence of external light. The camera and illumination housing can be moved over the vibrating platform on two substantially horizontal guide rails, in order to detect the orientation and the position of the parts.

Figure 3:
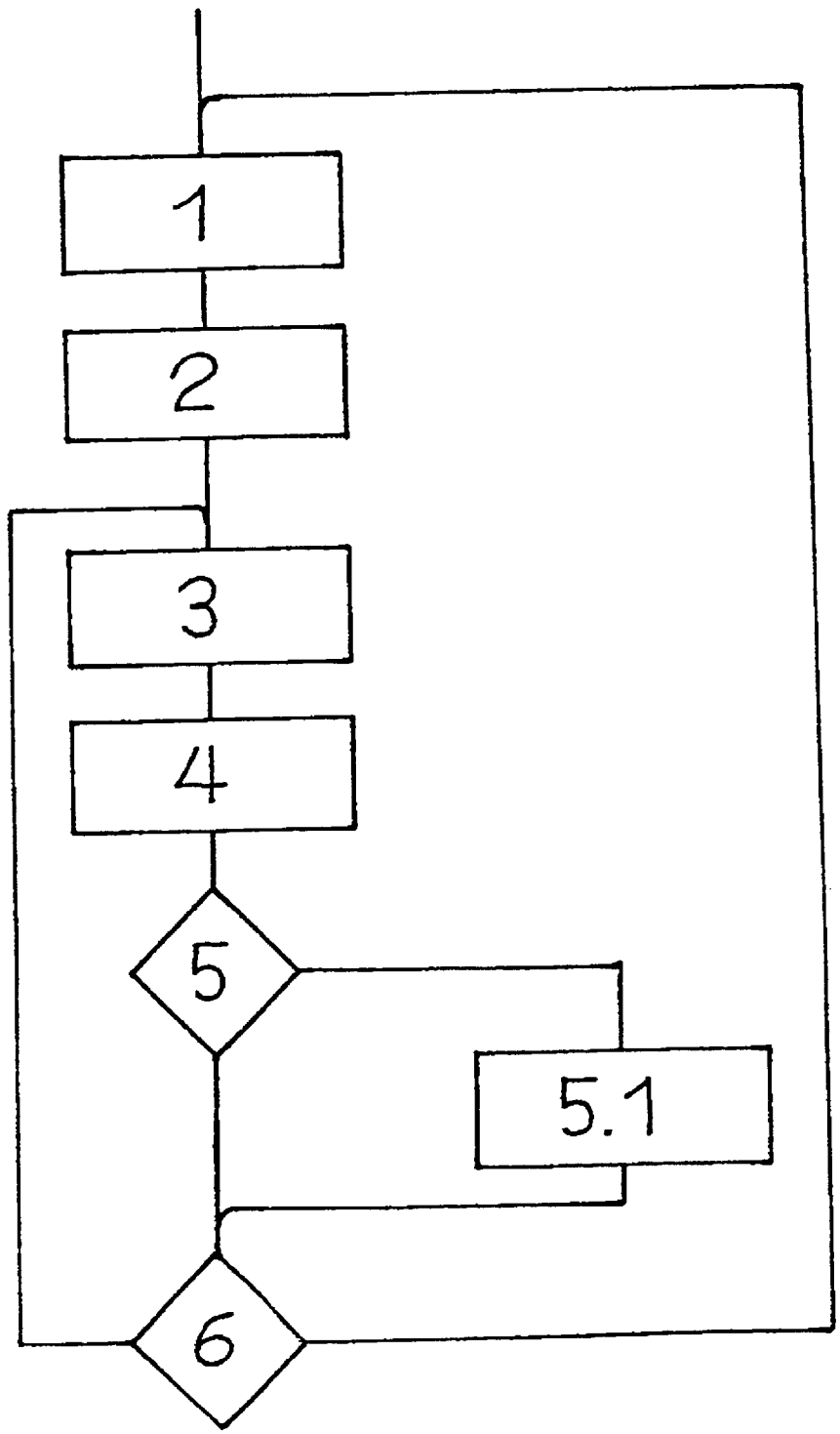
FIG. 3 shows a diagrammatic, schematic representation of the progress of a preferred type of embodiment of the method according to the invention for the operation of a parts feeder for a robot.

For the operation of the parts feeder illustrated in FIGS. 1 and 2 for a robot, the following steps are executed one after another in a continuous endless procedure, which is illustrated diagrammatically in FIG. 3.

In a first step 1, the parts recirculation element 30 is brought into its first position for loading the vibrating platform 40 with parts from the parts recirculation element 30, and the vibrating platform 40 is loaded with parts from the parts recirculation element 30. In this case, the parts flow directly from the parts recirculation element 30 onto the vibrating platform 40 merely on account of the force of gravity.

In a second step 2, the parts recirculation element 30 is brought into its second position for collecting parts which fall down from the vibrating platform 40.

In a third step 3, in a shaking or vibration operation, the vibrating platform 40 is vibrated in accordance with the set frequency, amplitude and duration. As a result of the vibrating movement of the platform 40, the parts lying on the vibrating platform 40 are thrown up repeatedly, in order to separate them and to change their orientation and their position stochastically. During the shaking operation, individual parts can fall down from the vibrating platform 40, over its edge facing the parts recirculation element 30, from the platform 40, falling directly onto the parts recirculation element 30.

In a fourth step 4, with the vibrating platform 40 at rest, the orientation and the position of the parts on the vibrating platform 40 are then detected, by the housing with the camera and the illumination means being moved over the vibrating platform 40. At the same time, the vibrating platform 40 is illuminated by the illumination means, and the surface of the vibrating platform 40 is scanned optically by the camera. By means of a suitable image recognition device, the orientation and the position of the parts on the vibrating platform 40 are determined on the basis of the optical data determined by the camera, and the parts which are oriented and positioned suitably for selection by the robot are determined, and their orientation and position data are transmitted to the robot.

In a fifth step 5, the determined orientation and position data are first used to check whether there are parts suitable for selection by the robot on the vibrating platform 40. If this is so, in a part step 5.1, depending on the transmitted orientation and position data, the parts with a favorable orientation and position are selected by the robot, that is to say they are gripped directly by the robot on the stationary vibrating platform 40 and are conveyed away for further processing. If there are no suitable parts on the vibrating platform 40, the part step 5.1 is left out.

In a sixth step 6, first of all the number of parts remaining on the vibrating platform 40 is determined. Then, depending on this number, a return is made either to the third step or to the first step. If the number of parts remaining on the vibrating platform 40 is lower than a predefined minimum number, then a return is made to the first step, otherwise to the third step.

It is not absolutely necessary for all the steps of the method to be carried out completely one after another; instead, individual steps can also be carried out in an at least partly overlapping manner, in order to accelerate the progress of the method.

In summary, it is to be recorded that, by means of the invention, a parts feeder is provided which is simple in design terms, space-saving and flexible in relation to different parts forms.

What is claimed is:

1. A parts feeder for a robot, having a selection zone accessible to the robot, comprising:
   a vibrating platform for changing the orientation and/or the position of the parts stochastically, said vibrating platform comprising the selection zone,
   a device with a parts recirculation element for recirculating the parts, and
   a drive for displacing the parts recirculation element and/or the vibrating platform into two different positions relative to each other, so that in the fist position the parts from the parts recirculation element are conveyed to the vibrating platform by the force of gravity and that in the second position, the parts which fall down from the vibrating platform are collected by the parts recirculation element.

2. The parts feeder according to claim 1, wherein the parts recirculation element is designed in a trough form in order to assist the collection of the parts in the second position.

3. The parts feeder according to claim 1, wherein the parts recirculation element is provided with an interchangeable upper part, an upper side of said upper part being adapted to a desired number of parts which, in the first position of the parts recirculation element, are conveyed from the parts recirculation element to the vibrating platform in order to load the vibrating platform.

4. The parts feeder according to claim 1, wherein the parts recirculation element is arranged in an immediate vicinity of the vibrating platform and can be displaced in a vertical direction between the first position for loading the vibrating platform and the second position for collecting the parts, in the first position the parts recirculation element being arranged at a level that is increased with respect to the vibrating platform and in the second position the parts recirculation element being arranged at a level that is lower with respect to the vibrating platform.

5. The parts feeder according to claim 1, wherein the vibrating platform is provided with an interchangeable supporting surface on an upper side of the platform, such that a surface structure of the supporting surface can be matched to the parts form.

6. The parts feeder according to claim 1, wherein the vibrating platform is effective to execute vibrating movements with a single mechanical degree of freedom.

7. The parts feeder according to claim 6, wherein the vibrating platform is designed to execute vibrating movements substantially in the vertical direction.

8. The parts feeder according to claim 6, wherein the vibrating platform is provided with a vibrating device for generating the vibrating movement, which permits optional setting of the frequency, the amplitude and the duration of the vibrating movement.

9. The parts feeder according to claim 1, further including a detection device for optical detection of the orientation and the position of the parts on the vibrating platform, and data transmission means for transmitting the detected orientation and position data to the robot.

10. The parts feeder according to claim 9, further including means for illuminating the vibrating platform, the detection device and the illumination means being arranged in a common housing.

11. The parts feeder according to claim 10, wherein the housing can be moved over the vibrating platform, in order to detect the orientation and the position of the parts.

12. A method for feeding parts to a robot, the following steps carried out in a continuous endless procedure, the steps comprising:

a) in a first step, a vibrating platform for changing the orientation and or the position of the parts stochastically by vibrating, and a parts recirculation element, are moved relative to each other into a first position, the vibrating platform then being loaded with parts from the parts recirculation element in this first position;

b) in a second step, the vibrating platform and the parts recirculation element are moved relative to each other into a second position in order that parts that fall down from the vibrating platform can be collected by the parts recirculation element;

c) in a third step, the orientation and/or the position of the parts on the vibrating platform can be changed stochastically by vibrating platform, any parts that fall down from the vibrating platform being collected by the parts recirculation element;

d) in a fourth step, the orientation and the position of the parts on the vibrating platform are detected, and the corresponding orientation and position data are transmitted to the robot;

e) in a firth step, depending on the transmitted orientation and position data, any parts with a favorable orientation and position are gripped by the robot on the vibrating platform and conveyed away;

f) in a sixth step, the number of parts remaining on the vibrating platform is determined, a return then being made either to the third step or to the first step, depending on said number of parts.

\* \* \* \* \*